US012790253B2

(12) United States Patent
Dannoux et al.

(10) Patent No.: US 12,790,253 B2
(45) Date of Patent: Nov. 10, 2026

(54) SYSTEMS AND METHODS FOR CONTACTLESS FORMATION OF TILTED OPTICAL WINDOWS FOR WAFER-LEVEL MICROELECTRONIC DEVICES

(71) Applicant: CORNING INCORPORATED, Corning, NY (US)

(72) Inventors: Thierry Luc Alain Dannoux, Avon (FR); Timothée Jean Marie Laloy, Chartrettes (FR)

(73) Assignee: CORNING INCORPORATED, Corning, NY (US)

( * ) Notice: Subject to any disclaimer, the term of this patent is extended or adjusted under 35 U.S.C. 154(b) by 54 days.

(21) Appl. No.: 18/672,638

(22) Filed: May 23, 2024

(65) Prior Publication Data

US 2024/0417303 A1 Dec. 19, 2024

Related U.S. Application Data

(60) Provisional application No. 63/521,506, filed on Jun. 16, 2023.

(51) Int. Cl.
*C03B 11/08* (2006.01)
*C03B 11/12* (2006.01)
*H10H 20/855* (2025.01)

(52) U.S. Cl.
CPC .......... *C03B 11/082* (2013.01); *C03B 11/122* (2013.01); *H10H 20/855* (2025.01); (Continued)

(58) Field of Classification Search
CPC ... C03B 23/03; C03B 11/08; C03B 2215/414; C03B 11/082; C03B 2215/50; (Continued)

(56) References Cited

U.S. PATENT DOCUMENTS 5,623,368 A 4/1997 Calderini et al.
5,876,642 A 3/1999 Calderini et al.
(Continued)

FOREIGN PATENT DOCUMENTS

JP 2007302484 A * 11/2007 ............. C03B 11/08
KR 20140085901 A * 7/2014 ......... C03B 23/0305

OTHER PUBLICATIONS

International Search Report and Written Opinion of the International Searching Authority; PCT/US2024/030166; dated Sep. 27, 2024; 11 pages; European Patent Office.

*Primary Examiner* — Erin Snelting
*Assistant Examiner* — Steven S Lee
(74) *Attorney, Agent, or Firm* — Kevin L. Bray; Ye Eun Park

(57) ABSTRACT

Disclosed are various approaches to creating optical windows in glass covers. To create the glass cover with the optical window, a sheet of glass is reformed using a mold that includes a male portion having a first recess and a female portion having a second recess. The female portion of the mold mates with the male portion of the mold. The first recess is configured to form a first gas pocket and the second recess is configured to form a second gas pocket when the male and female portions of the mold are mated, where a cross sectional area of each of the first recess and the second recess is less than 15 square millimeters. A portion of the reformed glass corresponding to the optical window is positioned between the first gas pocket and the second gas pocket.

11 Claims, 8 Drawing Sheets

(52) U.S. Cl.
CPC .. *C03B 2215/412* (2013.01); *C03B 2215/414* (2013.01); *C03B 2215/50* (2013.01); *C03B 2215/63* (2013.01)

(58) Field of Classification Search
CPC . C03B 2215/63; C03B 2215/41; H01L 33/58; H10H 20/855; H10H 20/08
See application file for complete search history.

(56) References Cited

U.S. PATENT DOCUMENTS

| | | | | |
|---|---|---|---|---|
| 6,347,536 | B1 | 2/2002 | Calderini et al. | |
| 10,377,625 | B2 | 8/2019 | Torkkeli et al. | |
| 2005/0184304 | A1 | 8/2005 | Gupta et al. | |
| 2011/0126588 | A1* | 6/2011 | Malach | C03B 23/0357 65/30.1 |
| 2015/0247959 | A1* | 9/2015 | Sannokyou | G02B 3/005 359/619 |
| 2016/0207818 | A1* | 7/2016 | Lee | B29C 43/04 |
| 2017/0029311 | A1* | 2/2017 | Brockmeier | C03B 11/08 |
| 2019/0135619 | A1* | 5/2019 | Quenzer | B81C 1/00317 |
| 2020/0385264 | A1* | 12/2020 | Brockmeier | B81C 1/00269 |
| 2021/0230041 | A1* | 7/2021 | Gindele | C03B 23/203 |

* cited by examiner

SYSTEMS AND METHODS FOR CONTACTLESS FORMATION OF TILTED OPTICAL WINDOWS FOR WAFER-LEVEL MICROELECTRONIC DEVICES

FIELD

This application relates to microelectronics packaging. More particularly, this application relates to optical windows with tilt to minimize back reflection in microelectronic devices.

BACKGROUND

This application claims the benefit of priority under 35 U.S.C § 120 of U.S. Provisional Application Ser. No. 63/521,506 filed on Jun. 16, 2023, the content of which is relied upon and incorporated herein by reference in its entirety.

Optical windows for microelectronic devices disposed on wafers require high quality glass surfaces for various optical applications. However, current approaches used to produce such optical windows do not produce the desired window quality or tend to be expensive and labor intensive.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

In the following discussion, the construction of optical microelectronic device packaging is described in which a glass window is created for wafer-level microelectronic devices such as silicon-based microelectromechanical (MEMS) devices. Such devices may be used in various applications such as, for example, light detection and ranging (LIDAR), heads up display systems, semiconductor optics, LEDs, lasers, sensors, detectors, or microelectromechanical devices.

In the following discussion, a general description of the system and its components is provided, followed by a discussion of the operation of the same.

Figure 1:
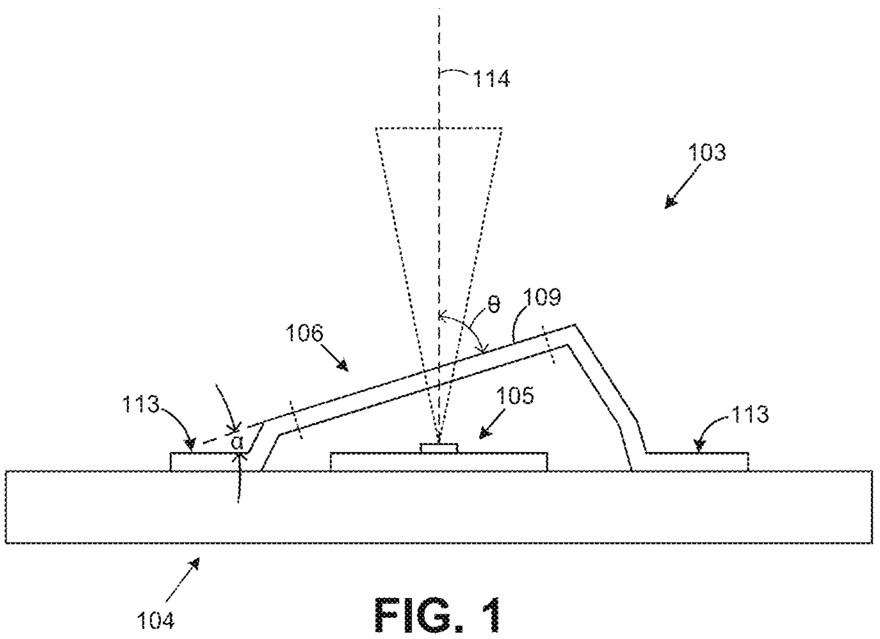
FIG. 1 is a drawing of a laser emitting assembly with a glass cover according to an embodiment of the present disclosure.

Referring to FIG. 1, according to one embodiment, shown is a sectional view of one example of a silicon-based microelectronic device 103 comprising, for example, a silicon wafer 104 or other type of substrate that includes a light emitting device 105. The silicon-based microelectronic device 103 also includes a glass cover 106 having a tilted optical window 109 through which light passes. The light emitting device 105 may include Light Detection and Ranging (LIDAR) elements, lasers or other optical elements. It is understood that the silicon-based microelectronic device 103 may comprise other types of devices beyond a light emitting device 105.

The optical window 109 comprises a local portion of the glass cover 106 where optical signals pass through. The optical window 109 preferably presents a non-degraded, untouched, pristine quality surface. In one embodiment, the optical window 109 has a surface roughness Ra (which refers to the Arithmetic Roughness Average) that is less than 0.4 nanometers. In another embodiment, the surface roughness Ra of the optical window falls within a range of around 0.2-0.4 nanometers as would be the case on the glass sheet to be formed into the glass cover 106 as will be described below. Any warpage of the optical window 109 is typically less than 100-200 μm over an area of approximately 3 mm×4 mm. In one embodiment, the area of the of the optical window 109 may comprise, for example, approximately 2.4 mm×3.0 mm or 7.2 square millimeters, although the dimensions may vary. For example, the area of the optical window 109 may fall within a range of 6 square millimeters to 9 square millimeters. In another embodiment, the area of the optical window 109 is less than 15 square millimeters.

The tilted optical window 109 is disposed at an angle α relative to a base surface 113 of the glass cover 106. The angle α can range, for example, from 10 degrees to 45 degrees depending on the application. The glass cover 106 may be attached to a base silicon wafer 104 of the light emitting device 105 by way of diffusion bonding, anodic bonding, glass frit sintering, polymer bonding, or other type of attachment. The angle α may also be defined as an angle of the optical window 109 relative to an axis that is perpendicular to an optical axis 114 of light or laser radiation emitted from the light emitting device 105. As an alternative, the optical window 109 may be defined as being disposed at an oblique angle θ relative to the optical axis 114 of the light emitting device 105. Such an optical axis 114 comprises an axis associated with the direction of propagation of the light or laser radiation emitted from the light emitting device 105.

The optical window 109 is tilted by the angle α such that an angle is created with respect to an optical axis of the light produced by the light emitting device 105 to minimize unwanted reflection of the light such as back reflection. The glass cover 106 preferably serves to hermitically seal the light emitting device 105.

Figure 2:
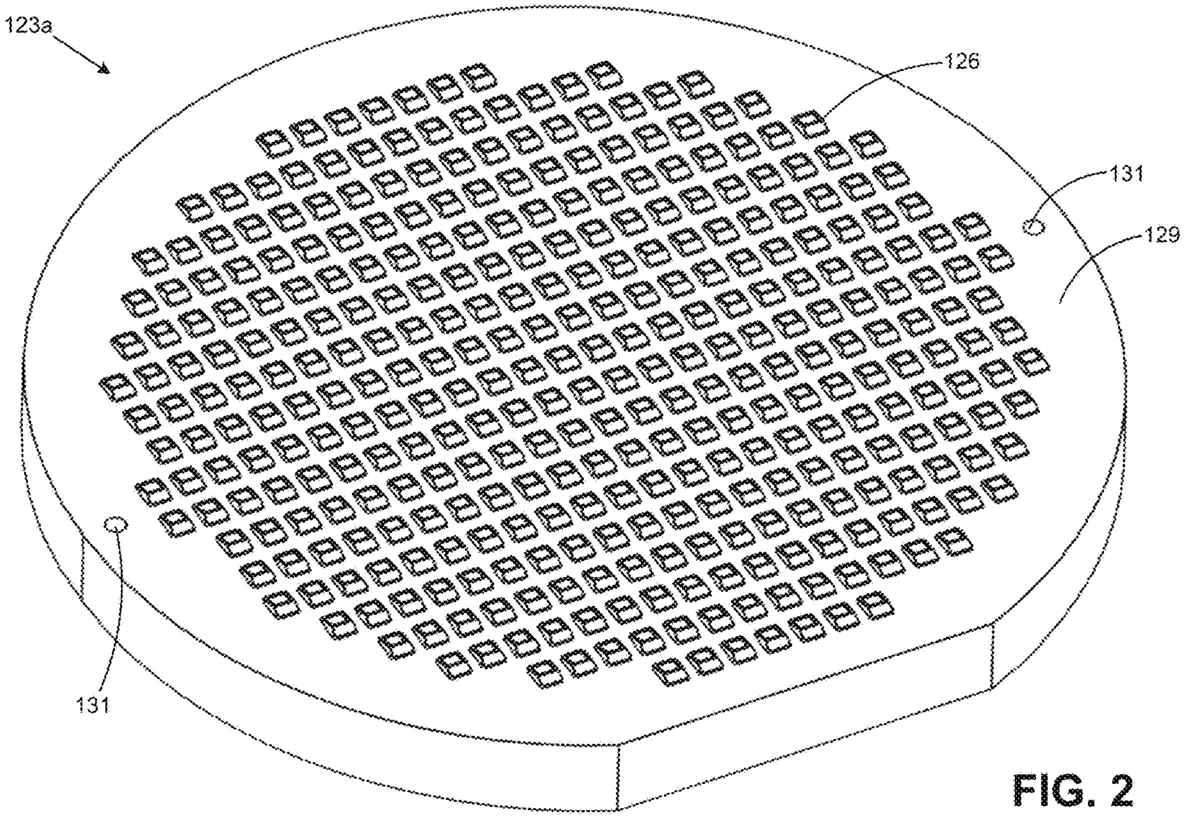
FIG. 2 is a drawing of a male portion of a mold to create the glass cover of FIG. 1 according to various embodiments of the present disclosure.

Referring next to FIG. 2, shown is a male portion of a mold denoted herein as male mold portion 123*a* according to one embodiment. The male mold portion 123*a* includes a plurality of projections 126 that extend from a male base surface 129.

Ultimately, each of the projections 126 provides for the reforming of a portion of a glass sheet into a glass cover 106 (FIG. 1) with an optical window 109 (FIG. 1) that is positioned at the angle α (FIG. 1) relative to a base surface 113 (FIG. 1) of the glass cover 106 as described above. Each projection 126 on the male mold portion 123*a* provides for a separate glass cover 106 with a corresponding optical window 109, where the plurality of projections 126 shown in FIG. 2 will provide for a corresponding number of glass covers 106 after a singulation process is undertaken as will be described.

The male mold portion 123*a* further includes guide holes 131 that provide for alignment of the male mold portion 123*a* with a counterpart female mold portion as will be described.

Figure 3:
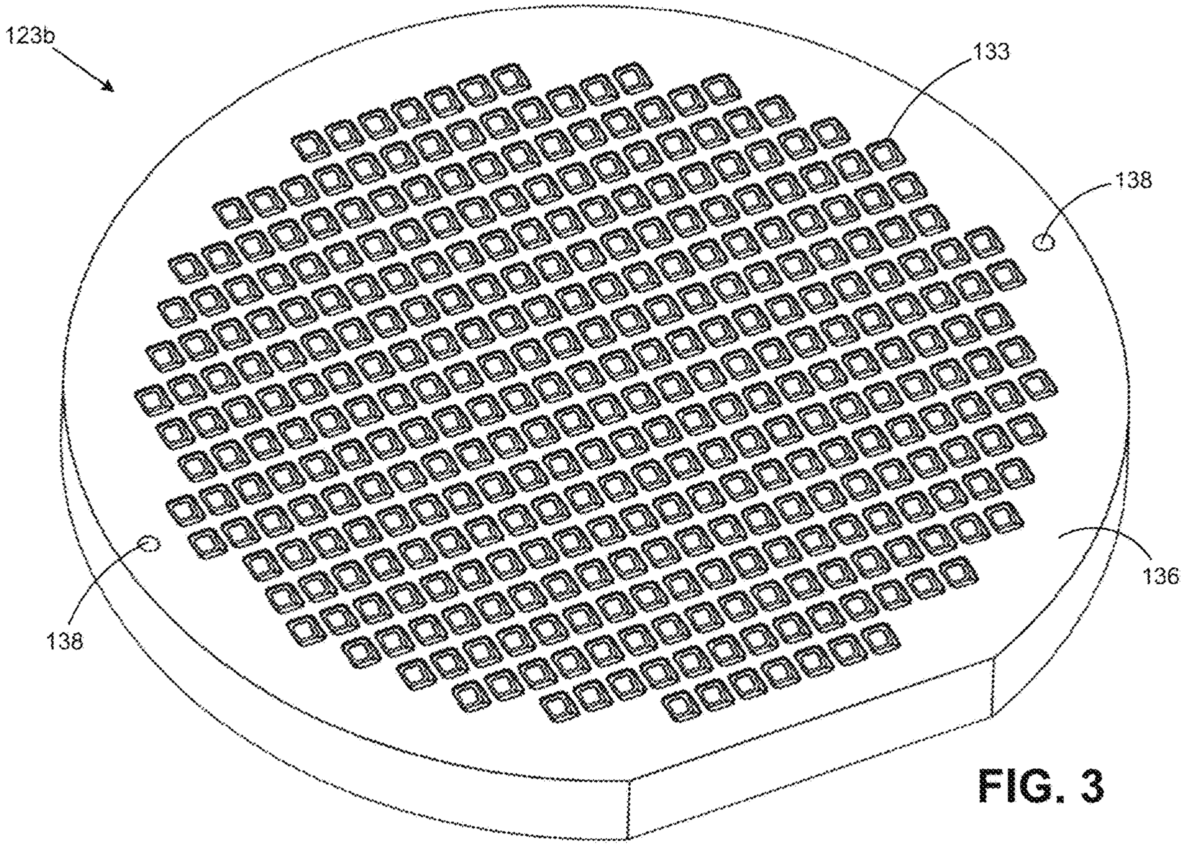
FIG. 3 is a drawing of a female portion of a mold to create the glass cover of FIG. 1 according to various embodiments of the present disclosure.

Referring next to FIG. 3, shown is a female portion of a mold denoted herein as female mold portion 123*b* according to one embodiment. The female mold portion 123*b* includes a plurality of reforming recesses 133 that extend into a female base surface 136.

When the male mold portion 123*a* (FIG. 2) and the female mold portion 123*b* are mated together, each of the reforming recesses 133 mates with a corresponding one of the projections 126 (FIG. 2). The male and female mold portions 123*a/b* are employed to reform a sheet of glass such that a number of glass covers 106 (FIG. 1) are created that each includes an optical window 109 (FIG. 1) that is disposed at the angle α relative to a base surface 113 (FIG. 1) of the glass cover 106 as will be further described.

The female mold portion 123*b* includes guide holes 138 that are used to align the female mold portion 123*b* by way of a guide pin (not shown) with the male mold portion 123*a* when reforming a glass sheet.

The male and female mold portions 123*a* and 123*b* may be constructed from graphite, boron nitride, glassy carbon, or other appropriate material that is both machinable and can withstand the temperatures experienced when reforming glass structures as will be described in further detail below. In one embodiment the male and female mold portions 123*a* and 123*b* are constructed from a material having a degree of anti-adhesion with respect to glass. In one embodiment, the degree of anti-adhesion with respect to glass is substantially similar to the anti-adhesion with respect to glass for materials such as graphite, boron nitride, glassy carbon, or other materials. In one embodiment, a high degree of anti-adhesion is defined by a high contact angle of melted glass on the respective material from which a mold 123 is created at a working temperature. For example, such high contact angles may be specified as greater than 90 degrees or some other threshold angle.

In another embodiment, the Coefficient of Thermal Expansion of the material used to construct the male and female mold portions 123*a* and 123*b* is close to the Coefficient of Thermal Expansion of the glass that is to be molded into a given shape.

Figure 4:
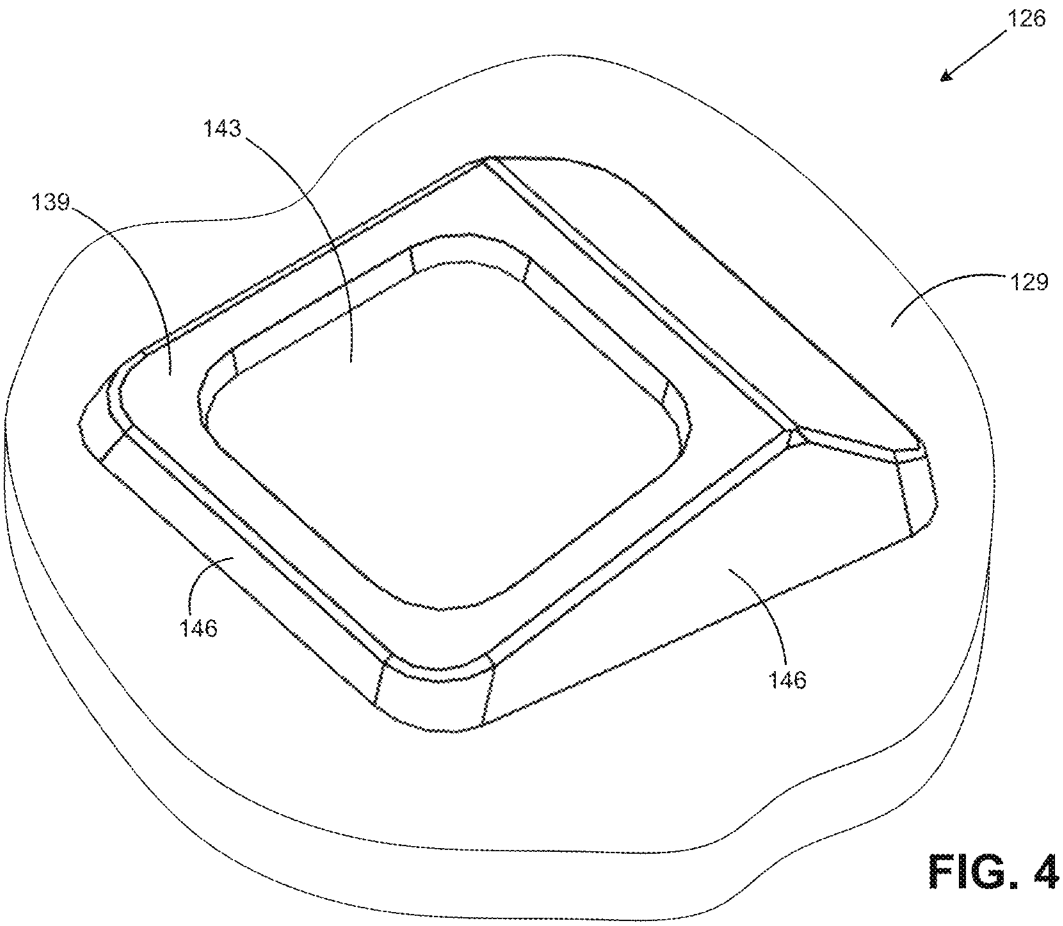
FIG. 4 is a drawing that depicts a projection that is part of the male portion of the mold of FIG. 2 according to various embodiments of the present disclosure.

Referring next to FIG. 4, shown is one example of a projection 126 disposed on the male mold portion 123*a* (FIG. 2) according to an embodiment of the present disclosure. The projection 126 includes a press surface 139 that is positioned at the angle α relative to the male base surface 129 of the male mold portion 123*a*.

A recess 143 is positioned on the press surface 139. In one embodiment, the recess 143 is positioned in the middle of the press surface 139. However, it is possible that the recess 143 may be positioned at any location on the press surface 139. In one embodiment, the press surface 139 surrounds the recess 143. As depicted in FIG. 4, the recess 143 is a trapezoid shape with rounded corners, although the recess 143 may be some other shape such as round, square, or other shape. The trapezoidal shape is due in part to the tapered sides of the projection 126. In one embodiment, the recess 143 has a cross sectional area of 2.4 mm×3 mm or 7.2 square millimeters, although the dimensions may vary. In another embodiment, the cross sectional area of the recess 143 may comprise approximately 3.5 mm×4 mm or 14 square millimeters. The cross sectional area of the recess 143 may fall within a range of 6 square millimeters to 15 square millimeters or other range as is appropriate. In another embodiment, the cross sectional area of the recess 143 is less than 15 square millimeters.

In one embodiment, the recess 143 comprises a machined cavity having been created using micro-milling techniques. Alternatively, the recess 143 may be formed using other approaches.

In one embodiment, the projection 126 includes side walls 146 that are tapered such that glass that is reformed by being pressed against the projection 126 can be more easily removed once cooled.

Figure 5:
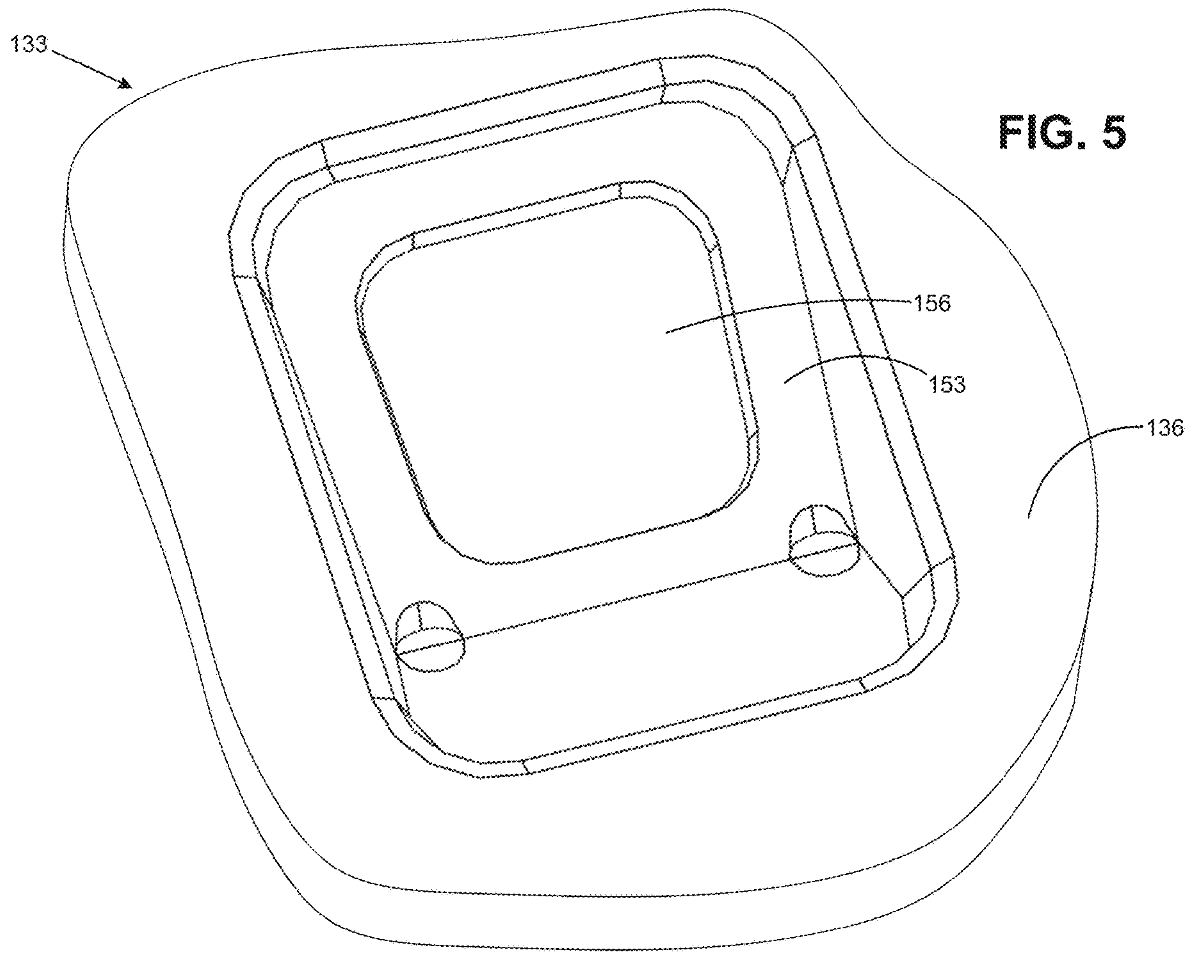
FIG. 5 is a drawing that depicts a reforming recess that is part of the female portion of the mold of FIG. 3 according to various embodiments of the present disclosure.

Referring next to FIG. 5, shown is an example of a reforming recess 133 that is included in the female mold portion 123*b* (FIG. 3) according to an embodiment of the present disclosure. The reforming recess 133 includes a press surface 153 that is positioned at the angle α relative to the female base surface 136 of the female mold portion 123*b* as will be described. Also, a recess 156 extends inward from the press surface 153. Like the recess 143 (FIG. 4), the recess 156 comprises a machined cavity created using micro-milling techniques. Alternatively, the recess 156 may be formed using other approaches.

Like the recess 143 (FIG. 4), in one embodiment, the recess 156 has a cross sectional area of 2.4 mm×3 mm or 7.2 square millimeters, although the dimensions may vary. In another embodiment, the cross sectional area of the recess 156 may comprise approximately 3.5 mm×4 mm or 14 square millimeters. The cross sectional area of the recess 156 may fall within a range of 6 square millimeters to 15 square millimeters or other range as is appropriate. In another embodiment, the cross sectional area of the recess 156 is less than 15 square millimeters.

According to one embodiment, the press surface 153 of the reforming recess 133 is positioned such that it faces the press surface 139 (FIG. 1) of the projection 126 (FIG. 1). When the male mold portion 123*a* (FIG. 2) is forced together with the female mold portion 123*b* to reform a sheet of glass, the press surfaces 139 and 153 press against opposing sides of the sheet of glass as will be described.

Referring to both FIGS. 4 and 5, the recesses 143 and 156 are configured to form gas pockets when the male mold portion 123*a* and female mold portion 123*b* are mated as will be described. Also, the press surfaces 139 and 153 may be separated into a number of points or smaller surfaces that surround the respective recesses 143 and 156.

Figure 6A:
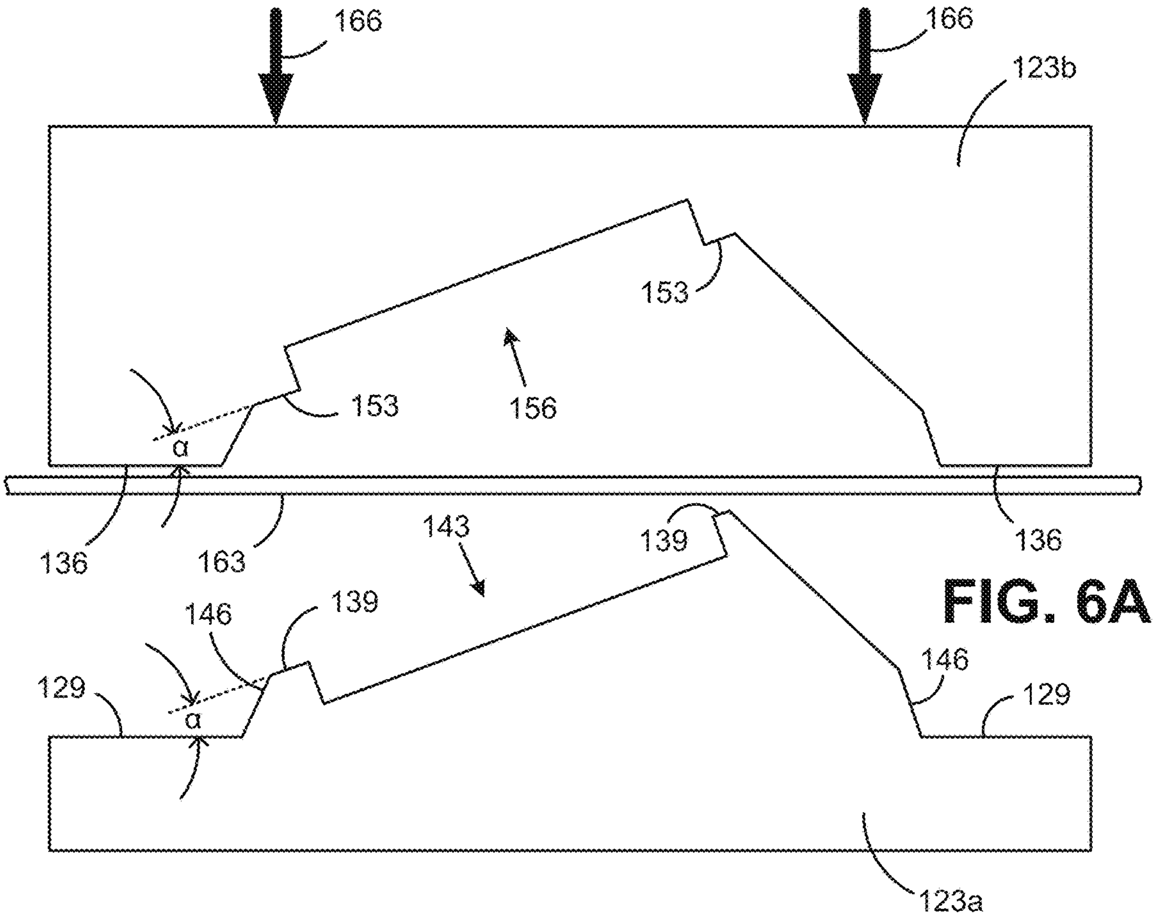
FIGS. 6A and 6B are sectional views of a portion of the male and female mold portions of FIGS. 2 and 3 as they are employed to create reformed glass according to various embodiments of the present disclosure.
Figure 6B:
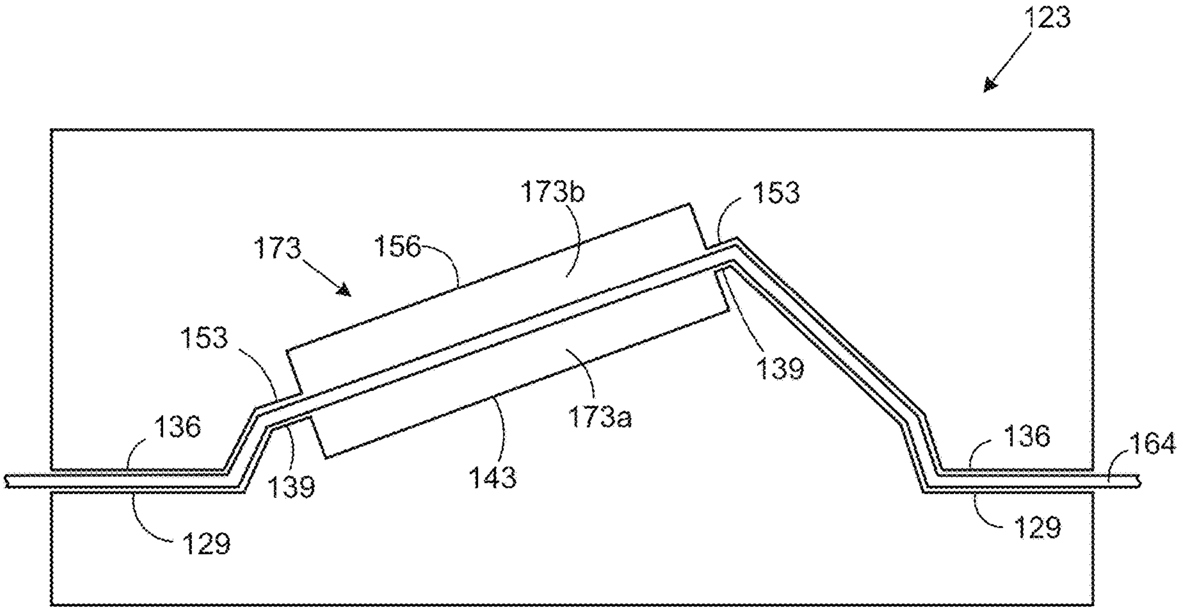

Referring next to FIGS. 6A and 6B, shown are sectional views of a portion of a mold 123 that comprises a portion of the male and female mold portions 123*a* and 123*b* as they are used to reform a glass sheet 163. The male mold portion 123*a* includes the press surface 139 that is disposed at the angle α relative to the male base surface 129. The recess 143 extends into the body of the male mold portion 123*a* from the press surface 139. The side walls 146 extend from the press surface 139 to the male base surface 129. As mentioned above, the side walls 146 are tapered to facilitate removal of reformed glass after cooling.

The female mold portion 123$b$ includes the recess 156 that extends into the female mold portion 123$b$ from the press surface 153 that is disposed at the angle α relative to the female base surface 136.

As shown in FIG. 6A, a glass sheet 163 is positioned between the male and female mold portions 123$a$ and 123$b$ that make up the mold 123. In one embodiment, the glass sheet 163 has a thickness that falls with a range from 0.05 millimeters to 0.65 millimeters. Alternatively, the glass sheet 163 may be some other thickness.

The glass sheet 163 and the mold 123 are heated to a reforming temperature where the glass sheet 163 is deformable but still stiff enough to avoid any sagging or deformation such that the resulting optical window 109 (FIG. 1) is unable to function as an optical window due distortion or scattering of the light that passes therethrough. In one embodiment, the reforming temperature is about 20° Celsius to 30° Celsius below the softening point of the glass sheet 163 such as the glass that will be described below.

Once the glass sheet 163 has been heated to the desired reforming temperature, a force 166 is applied to the mold 123 to cause the male and female mold portions 123$a$ and 123$b$ to come together to reform the glass sheet 163. In one embodiment, the force 166 is applied to one of the male or female mold portions 123$a$ or 123$b$ while the other is held in place on a platform or by a fixture. In another embodiment, a force 166 may be applied to both the male and female mold portions 123$a$ and 123$b$ to cause them to press together. In either case, the glass sheet 163 is reformed by the various structural components of both the male and female mold portions 123$a$ and 123$b$ (e.g., projection 126 and reforming recess 133).

With reference to FIG. 6B, shown is a portion of the mold 123 where the male and female mold portions 123$a$ and 123$b$ have been forced together such that the glass sheet 163 is reformed to provide reformed glass 164. Reformed glass 164 includes features that, when attached to a wafer 104 (FIG. 1) and singulated (see below), provide multiple glass covers 106 (FIG. 1). According to one embodiment, mechanical limits may be established such that a minimum gap or spacing is achieved between the various structures of the male and female mold portions 123$a$ and 123$b$ of the mold 123.

As shown, the recess 143 in the press surface 139 of the male mold portion 123$a$ aligns with the recess 156 in the press surface 153 of the female mold portion 123$b$. The recess 143 thus forms a gas pocket 173$a$ adjacent to the reformed glass 164. Also, the recess 156 forms a gas pocket 173$b$ adjacent to the reformed glass 164. When the male and female mold portions 123$a$ and 123$b$ are forced together, thereby resulting in reformed glass 164, the press surfaces 139 and 153 contact a respective side of the reformed glass 164 around the periphery of the gas pocket 173 or the respective gas pockets 173$a/b$. That is to say, the press surface 139 contacts a first surface or side of the reformed glass 164, and the press surface 153 contacts a second surface of the reformed glass 164. As a result, the portion of the reformed glass 164 that makes up the optical window 109 is suspended or positioned between the gas pockets 173$a$ and 173$b$. In the event that the press surfaces 139 and 153 may contact the reformed glass 164 at a plurality of points that surround the respective recesses 143 and 156. In another embodiment, the recesses 143 and 156 can be considered as forming a single gas pocket 173, where the reformed glass 164 is suspended or positioned in the single gas pocket.

As such, no part of the mold 123 comes into contact with the reformed glass 164 that makes up the optical window 109. In this manner, the optical window 109 is formed without degradation due to contact with the mold 123. To the extent that the portion of the reformed glass 164 making up the optical window 109 is heated to a reforming temperature that approaches a softening point of the glass sheet 163, imperfections on the surfaces of the optical window 109 are reduced or minimized by smoothing of the glass. In such case, the optical window 109 meets the parameters set forth with respect to FIG. 1 above.

In one embodiment, the portion of the reformed glass 164 that makes up the optical window 109 is suspended or positioned between the gas pockets 173$a$ and 173$b$. In such an embodiment, the portion of the reformed glass 164 may be suspended or positioned such that a volume of the portions of the gas pockets 173$a$ and 173$b$ on either side of the portion of the reformed glass 164 are equal or substantially equal. Alternatively, the portion of the reformed glass 164 may be suspended or positioned such that the volume of the respective gas pockets 173 on either side of the portion of the reformed glass 164 are unequal. In one embodiment, the recesses 143 and 156 are at least substantially symmetrical if not symmetrical in shape and size. Alternatively, the recesses 143 and 156 may be asymmetrical in shape and size. In addition, as shown in FIG. 6B, one or more walls of the recess 143 may be aligned with a corresponding one or more walls of the recess 156 when the male and female mold portions 123$a$ and 123$b$ are pressed together as shown.

In addition, the gas in each gas pocket 173$a$ and 173$b$ may comprise, for example, air, nitrogen, or other gas. If the gas is other than air, a purging of air may be performed in a furnace where the mold 123 is located when reforming a glass sheet 163 as can be appreciated.

Figure 7:
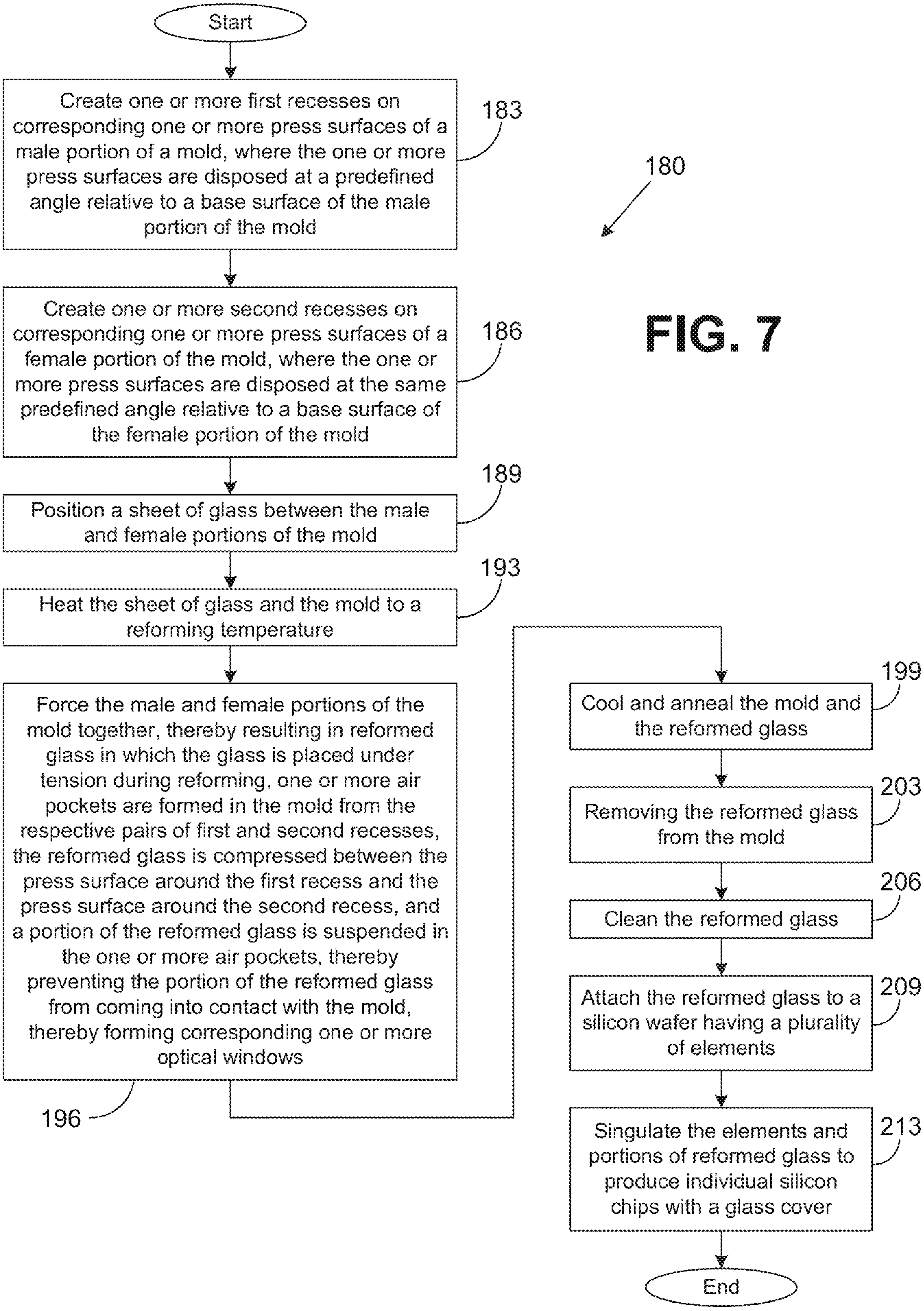
FIG. 7 is a flow chart that depicts a method for making reformed glass with the male and female portions of the mold of FIGS. 2 and 3 according to various embodiments of the present disclosure.

Referring next to FIG. 7, shown is a method 180 for creating one or more glass covers 106 (FIG. 1) according to an embodiment of the present disclosure. In one embodiment, the following steps of the method are performed serially. Alternatively, two or more of the steps set forth in FIG. 7 may be performed concurrently or with partial concurrence.

To begin, in step 183 one or more recesses 143 (FIG. 4) are created on a corresponding one or more press surfaces 139 (FIG. 4) disposed on a respective one or more projections 126 (FIG. 4) of a male mold portion 123$a$ (FIG. 4). Each recess 143 may be created using micro-milling techniques or other approaches as will be described below.

The one or more press surfaces 139 are disposed at the predefined angle α relative to a male base surface 129 (FIG. 4) of the male mold portion 123$a$. The angle α may vary. In one embodiment, the angle α can vary within a range from about 10° to 45°. Alternatively, the angle α may be any angle that allows the male and female mold portions 123$a$ and 123$b$ to press together to reform a given glass sheet 163 without creating unacceptable deformities, holes, or other anomalies in the resulting reformed glass 164.

Thereafter in step 186, one or more recesses 156 (FIG. 5) are created on a corresponding one or more press surfaces 153 (FIG. 5) disposed on a respective one or more reforming recesses 133 (FIG. 5) of a female mold portion 123$b$ (FIG. 5). Each recess 143/156 may be created using micro-milling techniques or other approaches. The depth of the recesses 143 and/or 156 is specified so that the portion of the glass sheet 163 making up the optical window 109 (FIG. 1) does not touch the material making up the male or female mold portion 123$a$/123$b$. For example, in one embodiment, the depth of the recess 143 and/or the recess 156 relative to the respective press surfaces 139 and 153 is within a range of 0.2 millimeters to 0.5 millimeters, although the depth of the recess 143 and/or the recess 156 may be outside of this range provided that the portion of the glass sheet 163 making up the optical window 109 does not touch the material of the male or female portions 123*a*/123*b* and, at the same time, the recesses 143/156 are not too deep such that the resulting structures on the male or female portions 123*a*/123*b* are at undue risk for chipping or other problems over many cycles of mold use.

In addition, the depth of the recesses 143 and/or 156 is not specified too deep so that the remaining portions of the press surfaces 139 and 153 are not too thin. The reason for this is the lack of material surrounding the recesses 143 and 156 making up the press surfaces 139 and 153 would be subject to accelerated degradation upon multiple uses of the mold 123 (FIG. 6B). In this respect, in one embodiment the depth of the recesses 143 and 156 are specified so that the respective male and female mold portions 123*a* and 123*b* will last through at least 10,000 mold cycles without unacceptable degradation to spread out the cost of making the mold 123 over many different glass covers 106. In one embodiment, the press surfaces 139 and 153 have a minimum width surrounding the respective recesses 143 and 156 of approximately 0.4 mm or even 0.5 mm. Thus, the width of the press surfaces 139 and 153 is specified to minimize chipping or other mold degradation and yet, the width of the press surfaces 139 and 153 is thin enough to provide for an adequate size of the optical window 109. In one embodiment, the area of the of the optical window 109 may comprise approximately 2.4 mm×3.0 mm or 7.2 square millimeters, although the dimensions may vary. In another embodiment, the area of the optical window 109 may comprise approximately 3.5 mm×4 mm or 14 square millimeters. For example, the area of the optical window 109 may fall within a range of 6 square millimeters to 15 square millimeters.

The one or more press surfaces 153 are disposed at the predefined angle α relative to female base surface 136 (FIG. 5) of the female mold portion 123*b*. The angle α may vary. In one embodiment, the angle α can vary within a range from about 10° to 45° depending on the specific application. Alternatively, the angle α may be any angle that allows the male and female mold portions 123*a* and 123*b* to press together to reform a given glass sheet 163 without creating unacceptable deformities, holes, or other anomalies in the resulting reformed glass 164.

The angle α may be specified to avoid return loss and to minimize the effect of light from sources outside the optical window 109. The higher the angle α, the more unwanted radiation that may be eliminated. Angles α employed in optical fiber applications may be as low as 6° or other angle.

Next in step 189, a glass sheet 163 (FIGS. 6A/6B) is positioned between the male and female mold portions 123*a* and 123*b* of the mold 123. The glass sheet 163 may comprise any one of a number of different glass compositions. For example, the glass sheet 163 may be any one of the following glass formulations manufactured by Corning Incorporated of Corning, New York such as, for example, 7740 (Pyrex), 7070, 7607 Na Contego, BF33 Borofloat, SG3.4 (EXG), Eagle XG glass, or other types of glass. These names of the respective glass formulations are trademarks of Corning Incorporated of Corning, New York. The glass sheet 163 may comprise, for example, standard size 6 inch or 8 inch discs that correspond to the diameter of the male and female mold portions 123*a* and 123*b* as can be appreciated.

In step 193, the glass sheet 163 and the male and female mold portions 123*a* and 123*b* are heated to a reforming temperature. This is accomplished by placing these items in an oven designed to heat such elements to the reforming temperature. The reforming temperature depends upon the specific type of glass employed. In one embodiment, the reforming temperature is the temperature at which the glass sheet 163 is deformable but still sufficiently stiff such that little or no sagging of the glass occurs in the portion of the glass sheet 163 that is suspended in the gas pocket 173 (FIG. 6B). That is to say, the glass will not sag or deform under its own weight in a manner that is perceptible. In one embodiment, the reforming temperature falls within 20 to 30 degrees Celsius below the softening point of the respective glass employed. For example, for 7607 glass manufactured by Corning Incorporated of Corning, New York, the reforming temperature may be approximately 856° Celsius where the softening point of 7607 glass is 886° Celsius. In another example, for Eagle XG© glass manufactured by Corning Incorporated of Corning, New York, the reforming temperature may be approximately 950° Celsius where the softening point of Eagle XG glass is 971° Celsius. Eagle XG® glass is a trademark of Corning Incorporated of Corning, New York.

In addition, where a melting viscosity of glass may be approximately $10^4$ Poise and the softening viscosity of the glass is $10^{7.6}$ Poise, the reforming temperature is specified so that the viscosity of the glass is approximately $10^8$ Poise.

The stiffness or viscosity of the glass is specified so as to avoid deformation of the optical window 109 that may result in a prism effect in the area of the optical window 109 such that the sides of the glass are not parallel. If the sides of the glass are not parallel, a prism effect that results can potentially cause unwanted separation of visual frequencies of light.

Moving on to step 196, the male and female mold portions 123*a* and 123*b* are forced together, thereby resulting in reformed glass 164 (FIG. 6B). As mentioned above, force may be applied to one of the male and female mold portions 123*a* or 123*b*, where the remaining one of the male or female mold portions 123*a* or 123*b* are held in place. Alternatively, a force may be applied to both the male and female mold portions 123*a* and 123*b* to bring them together.

In one embodiment, the male and female mold portions 123*a* and 123*b* are forced together after the mold 123 and the glass sheet 163 have reached the reforming temperature described above. In an alternative embodiment, the male and female mold portions 123*a* and 123*b* may be forced together at some point before the mold 123 and the glass sheet 163 reach the reforming temperature.

According to one embodiment, the glass is placed under tension when the male and female mold portions 123*a* and 123*b* are forced together. This is due to the fact that the glass material is stretched following the contour of the projections 126. Adjacent ones of the projections 126 effectively create even tension in the glass that is reformed by a respective one of the projections 126.

In one embodiment, further projections or a ridge is added around the periphery of the male mold portion 123*a* and corresponding recesses or channels are created in the female mold portion 123*b* to place the glass under tension at projections 126 on the edges of a given male mold portion 123*a*.

In addition, when the male and female mold portions 123*a* and 123*b* are forced together to reform the glass sheet 163 into the reformed glass 164, the gas pockets 173*a* (FIG. 6B) and 173*b* (FIG. 6B) are formed. When the male and female mold portions 123*a* and 123*b* are pressed together as far as limits allow, the reformed glass 164 is compressed between the respective press surfaces 139 and 153 around the respective recesses 143 and 156. This holds the respective portions of the reformed glass 164 that comprise one or more optical windows 109 to suspend or position the portion of the reformed glass 164 between the respective gas pockets 173*a*/173*b*. This prevents the one or more portions of the reformed glass 164 that comprises corresponding one or more optical windows 109 from coming into contact with the mold 123, thereby forming the optical windows 109 with optimal surface quality.

Next in step 199, the mold 123 with the reformed glass 164 is cooled and annealed. In one embodiment, the rate of cooling from the reforming temperature is 10° Celsius per minute or other rate commensurate with annealing conditions. In one embodiment, the reformed glass 164 may be cooled down from the reforming temperature by a predefined amount to ensure the reformed glass 164 retains its shape and the force that presses together the male and female mold portions 123*a* and 123*b* is removed. The mold 123 and the reformed glass 164 are then further cooled to room temperature. In a further embodiment, the force that presses together the male and female mold portions 123*a* and 123*b* may be maintained through the entire heating and cooling process.

Thereafter in step 203, the reformed glass 164 is removed from the mold 123. The mold 123 is opened and the reformed glass 164 is removed from the male and female mold portions 123*a* and 123*b*.

In step 206, the reformed glass 164 is cleaned by soft ultrasonic action or using other appropriate methods.

Next in step 209, the cleaned reformed glass 164 is attached to a silicon wafer 104 (FIG. 1) having a plurality of microelectronic devices 103 (FIG. 1). Although Silicon is specified as the wafer material, other wafer materials may also be used. In one embodiment, each optical window 109 is positioned relative to corresponding microelectronic devices 103 on the silicon wafer 104. For example, in one embodiment, the microelectronic devices 103 of the silicon wafer 104 may comprise LIDAR elements such as lasers and other elements. In one embodiment, the reformed glass 164 is attached to the silicon wafer by way of ionic bonding or other approach described above.

The reformed glass 164 is attached in a manner such that the reformed glass 164 hermetically seals around each of the microelectronic devices 103 (FIG. 1) of the silicon wafer. As contemplated herein, a microelectronic device 103 is hermetically sealed when no air can move into or out of the volume contained by the microelectronic device 103, the silicon wafer 104, and a glass cover 106 (FIG. 1) by virtue of the attachment of the reformed glass 164 to the silicon wafer 104. As mentioned above, in one embodiment the microelectronic devices 103 may comprise light-emitting devices 105.

In step 213, the microelectronic devices 103 or other elements of the silicon wafer with the reformed glass 164 attached are singulated or cut into individual elements, thereby resulting in silicon chips with a corresponding glass cover 106 with an optical window 109. The singulation of the silicon wafer/glass assembly may be accomplished by use of a dicing saw, by way of nano perforation (e.g., with a laser), or by some other approach. Individual resulting chips may be, for example, 5 mm×7 mm in size. Alternatively, the resulting chips may be some other size depending on the application.

Figure 8A:
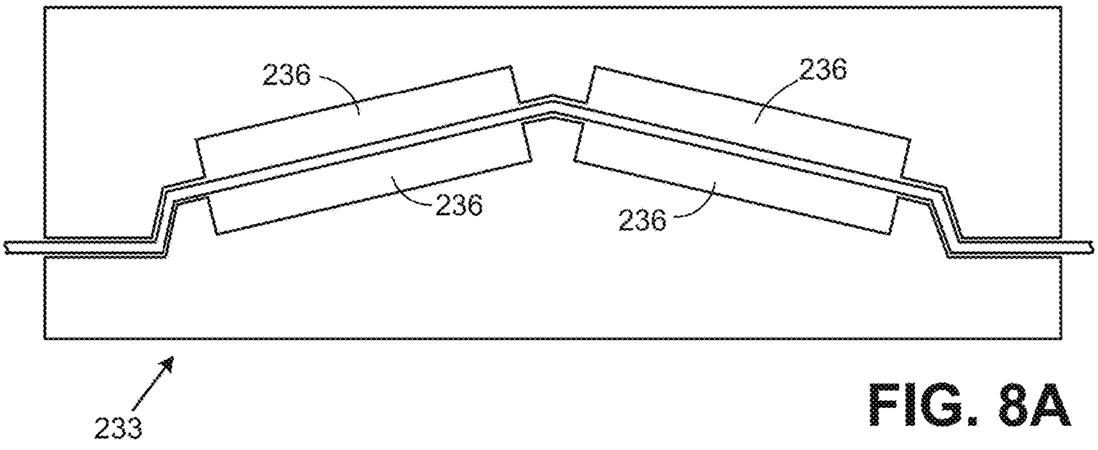
FIGS. 8A, 8B, and 8C depict mold configurations that facilitate the creation of multiple optical windows in a single projection according to various embodiments of the present disclosure.
Figure 8B:
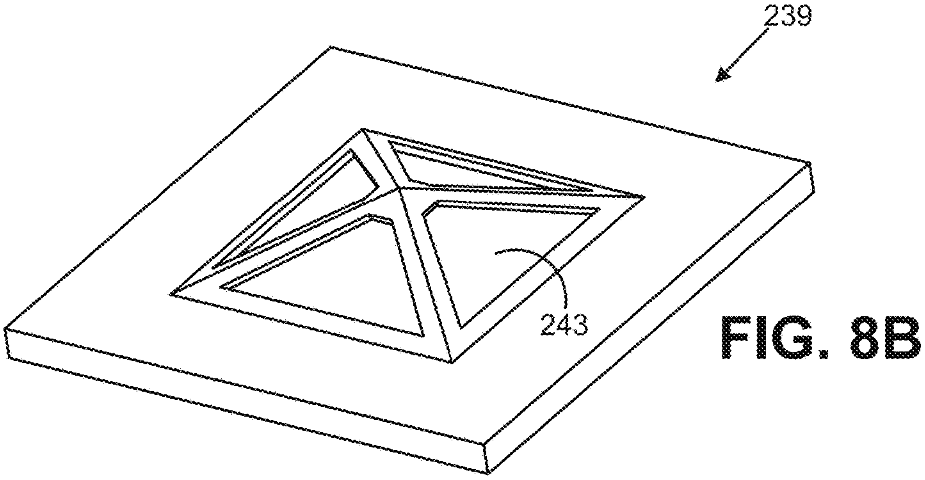
Figure 8C:
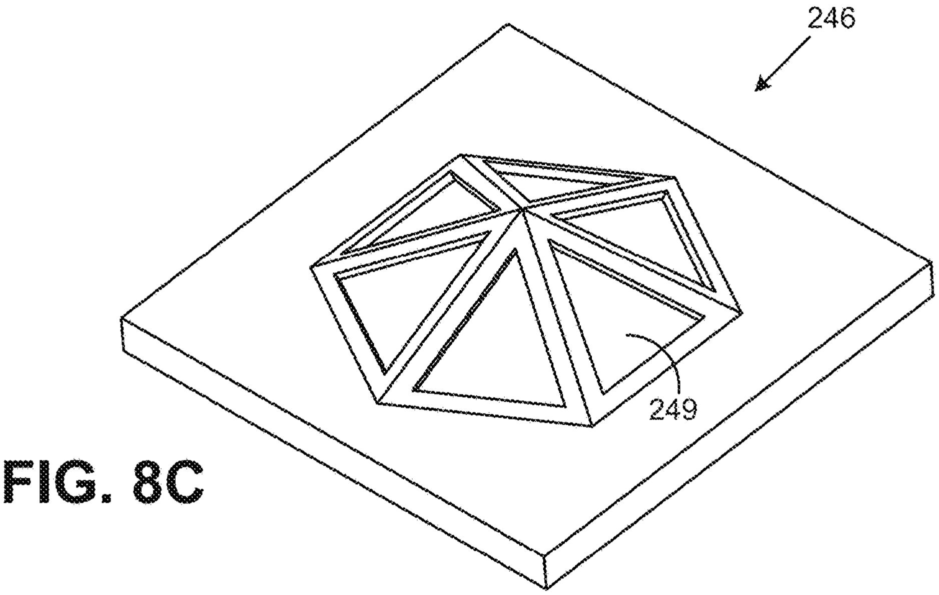

With reference to FIGS. 8A, 8B, and 8C, shown is a sectional view of a further example of various molds that may be used to produce glass covers 106 (FIG. 1) having a plurality of optical windows 109 (FIG. 1). As depicted in FIG. 8A, shown is a mold 233 that includes gas pockets 236 that are similar to the gas pockets 173*a/b* (FIG. 6B) described above. As such the resulting glass cover will have two different optical windows. In this respect, glass covers may be created according to the principles set forth herein that have more than one optical window 109.

With reference to FIG. 8B, shown is a square male mold portion 239 that includes four triangular recesses 243 according to one embodiment of the present disclosure. The square male mold portion 239 may be used with a corresponding female mold portion to produce a glass cover with four triangular optical windows. Referring to FIG. 8C, shown is a further example of a hexagonal male mold portion 246 that includes six triangular recesses 249. The hexagonal male mold portion 246 may be used with a corresponding female mold portion to produce a glass cover with six triangular optical windows.

With reference to FIGS. 1 through 8C, in view of the foregoing discussion, below is a description of various example embodiments of the present disclosure. It is understood that the below embodiments are not an exhaustive recitation of the possible embodiments of the present disclosure and that other embodiments are described herein.

Embodiment 1 is an apparatus, comprising a male portion of a mold having a first recess, and a female portion of the mold having a second recess. The female portion of the mold mates with the male portion of the mold, and the first recess is configured to form a first gas pocket and the second recess is configured to form a second gas pocket when the male and female portions of the mold are mated, where a cross sectional area of each of the first recess and the second recess is less than 15 square millimeters.

Embodiment 2 comprises an apparatus as set forth in embodiment 1, further comprising a sheet of glass disposed between the male and female portions of the mold.

Embodiment 3 comprises an apparatus as set forth in embodiments 1 or 2, wherein a gas in the first gas pocket and the second gas pocket comprises air.

Embodiment 4 comprises an apparatus as set forth in embodiments 1 or 2, wherein a gas in the first gas pocket and the second gas pocket comprises nitrogen.

Embodiment 5 comprises an apparatus as set forth in any one of embodiments 1 to 4, wherein at least one first wall of the first recess is aligned with a second wall of the second recess when the male and female portions of the mold are mated.

Embodiment 6 comprises an apparatus as set forth in any one of embodiments 1 to 5, wherein the first recess is aligned with the second recess when the male and female portions of the mold are mated.

Embodiment 7 comprises an apparatus as set forth in embodiment 1, further comprising a reformed glass disposed between the male and female portions of the mold, and a portion of the reformed glass is positioned between the first gas pocket and the second gas pocket.

Embodiment 8 comprises an apparatus as set forth in embodiments 1 or 7, wherein the first recess is positioned on a first press surface, and the second recess is positioned on a second press surface.

Embodiment 9 comprises an apparatus as set forth in embodiment 8 wherein the first press surface contacts a first surface of the reformed glass and the second press surface contacts a second surface of the reformed glass.

Embodiment 10 comprises an apparatus as set forth in embodiments 1, 8, or 9, wherein the reformed glass includes a projection.

Embodiment 11 comprises an apparatus as set forth in embodiment 1, further comprising the male portion of the mold having a projection extending from a base surface, the projection including a press surface, and the press surface being positioned at an angle relative to the base surface.

Embodiment 12 comprises an apparatus as set forth in embodiment 11, further comprising the first recess being positioned on the press surface.

Embodiment 13 comprises an apparatus as set forth in embodiment 11, wherein the press surface surrounds the first recess.

Embodiment 14 comprises an apparatus as set forth in embodiment 13, further comprising a reformed glass disposed between the male and female portions of the mold, the press surface contacting the reformed glass at a plurality of points, the plurality of points surrounding the first recess.

Embodiment 15 comprises an apparatus as set forth in embodiment 1, further comprising the female portion of the mold having a mold recess extending from a base surface, the mold recess including a press surface, and the press surface being positioned at an angle relative to the base surface.

Embodiment 16 comprises an apparatus as set forth in embodiment 15, wherein the angle is specified based on a reflection angle relative to a source of optical radiation.

Embodiment 17 comprises an apparatus as set forth in embodiments 15 or 16, wherein the angle is in a range from 10 degrees to 45 degrees.

Embodiment 18 comprises an apparatus as set forth in any one of embodiments 15-17, wherein the second recess is positioned on the press surface.

Embodiment 19 comprises an apparatus as set forth in any one of embodiments 15-18, wherein the press surface surrounds the second recess.

Embodiment 20 comprises an apparatus as set forth in embodiment 19, further comprising a reformed glass disposed between the male and female portions of the mold, the press surface contacting the reformed glass at a plurality of points, the plurality of points surrounding the second recess.

Embodiment 21 comprises an apparatus as set forth in any one of embodiments 1-20, wherein the mold is constructed from a material having a degree of anti-adhesion with respect to glass that is substantially similar to the degree of anti-adhesion of graphite with respect to glass.

Embodiment 22 comprises an apparatus as set forth in any one of embodiments 1-20, wherein the mold is constructed from a material having a degree of anti-adhesion with respect to glass that is substantially similar to the degree of anti-adhesion of boron nitride with respect to glass.

Embodiment 23 comprises an apparatus as set forth in any one of embodiments 1-20, wherein the mold is constructed from a material having a degree of anti-adhesion with respect to glass that is substantially similar to the degree of anti-adhesion of glassy carbon with respect to glass.

Embodiment 24 comprises an apparatus as set forth in any one of embodiments 1-20, wherein the mold is constructed from graphite.

Embodiment 25 is an apparatus, comprising a male portion of a mold having a plurality of first recesses; a female portion of the mold having a plurality of second recesses, where the female portion of the mold mates with the male portion of the mold; and each of the first recesses is configured to form a respective one of a plurality of first gas pockets, and each of the second recesses is configured to form a respective one of a plurality of second gas pockets when the male and female portions of the mold are mated, wherein a cross sectional area of each of the first recesses and each of the second recesses is less than 15 square millimeters.

Embodiment 26 comprises an apparatus as set forth in embodiment 25, further comprising a reformed glass disposed between the male and female portions of the mold, where the male and female portions of the mold are mated.

Embodiment 27 is a method comprising placing a sheet of glass between a male portion and a female portion of a mold, the male portion of the mold having a first recess and the female portion of the mold having a second recess; heating the sheet of glass and the mold to a reforming temperature; clamping the male and female portions of the mold together to form reformed glass from the sheet of glass, the reformed glass comprising an optical window corresponding to a portion of the sheet of glass disposed between the first recess and the second recess, the at least one optical window not contacting the male and female portions of the mold.

Embodiment 28 comprises a method as set forth in embodiment 27, wherein the clamping of the male and female portions further comprises placing the sheet of glass under tension.

Embodiment 29 comprises a method as set forth in embodiment 27, wherein the clamping of the male and female portions further comprises compressing the sheet of glass between a first press surface surrounding the first recess and a second press surface surrounding the second recess, the first press surface contacting a first side of the sheet of glass and the second press surface contacting a second side of the sheet of glass.

Embodiment 30 comprises a method as set forth in any one of the embodiments 27-29, further comprising annealing the reformed glass.

Embodiment 31 comprises a method as set forth in embodiment 30, further comprising removing the reformed glass from the mold.

Embodiment 32 comprises a method as set forth in embodiment 31, further comprising cleaning the reformed glass.

Embodiment 33 comprises a method as set forth in embodiment 32, further comprising attaching the reformed glass to a silicon wafer, where the silicon wafer comprises a microelectronic device, and the optical window is positioned over the microelectronic device.

Embodiment 34 comprises a method as set forth in embodiment 33, wherein the attaching hermetically seals the microelectronic device.

Embodiment 35 comprises a method as set forth in embodiment 34, wherein the microelectronic device is a light-emitting device, the light-emitting device configured to emit light through the optical window.

Embodiment 36 comprises a method as set forth in any one of embodiments 27-35, wherein the sheet of glass has a thickness within a range from 0.05 millimeters to 0.65 millimeters.

Embodiment 37 comprises a method as set forth in any one of embodiments 27-36, wherein a depth of the first recess relative to the first press surface in the male portion of the mold is within 0.2 millimeters to 0.5 millimeters.

Embodiment 38 comprises a method as set forth in any one of embodiments 27-37, wherein a depth of the second recess relative the second press surface in the female portion of the mold is within 0.2 millimeters to 0.5 millimeters.

Embodiment 39 is a method, comprising placing a sheet of glass between a male portion and a female portion of a mold, the male portion of the mold having a plurality of first recesses and the female portion of the mold having a plurality of second recesses; heating the sheet of glass and the mold to a reforming temperature; and clamping the male and female portions of the mold together to form reformed glass from the sheet of glass, the reformed glass comprising a plurality of optical windows corresponding to a plurality of portions of the sheet of glass disposed between corresponding ones of the first recesses and the second recesses, the corresponding ones of the first recesses and the second recesses preventing contact between the optical windows and the male and female portions of the mold.

Embodiment 40 comprises a method as set forth in embodiment 39, further comprising annealing the reformed glass.

Embodiment 41 comprises a method as set forth in embodiment 40, further comprising removing the reformed glass from the mold.

Embodiment 42 comprises a method as set forth in embodiment 41, further comprising cleaning the reformed glass.

Embodiment 43 comprises a method as set forth in embodiment 42, further comprising attaching the reformed glass to a silicon wafer, the silicon wafer comprising a plurality of microelectronic devices, where each of the optical windows is positioned over a corresponding one of the microelectronic devices.

Embodiment 44 comprises a method as set forth in embodiment 43, wherein the attaching hermetically seals individual ones of the microelectronic devices.

Embodiment 45 comprises a method as set forth in embodiments 43 or 44, further comprising dividing an assembly comprising the silicon wafer and the reformed sheet into a plurality of assemblies, each sub-assembly including one of the microelectronic devices and a corresponding one of the optical windows.

Embodiment 46 comprises a method as set forth in any one of embodiments 43-45, wherein the microelectronic device is a light-emitting device, the light-emitting device configured to emit light through the corresponding one of the optical windows.

Embodiment 47 comprises a method as set forth in any one of embodiments 39-46, wherein the sheet of glass has a thickness within a range from 0.05 millimeters to 0.65 millimeters.

Embodiment 48 comprises a method as set forth in any one of embodiments 39-47, wherein each of the first recesses is disposed on a corresponding one of a plurality of press surfaces on the male portion of the mold, where a depth of each of the first recesses relative to the corresponding one of the press surfaces is within 0.2 millimeters to 0.5 millimeters.

Embodiment 49 comprises a method as set forth in any one of embodiments 39-48, wherein each of the second recesses is disposed on a corresponding one of a plurality of press surfaces on the female portion of the mold, where a depth of each of the second recesses relative to the corresponding one of the press surfaces is within 0.2 millimeters to 0.5 millimeters.

Embodiment 50 is an apparatus, comprising a mold comprising a male portion of the mold having a first recess and a female portion of the mold having a second recess; an amount of reformed glass between the male portion of the mold and the female portion of the mold; a gas pocket formed from the first recess and the second recess; and a portion of the reformed glass is positioned in the gas pocket.

Embodiment 51 comprises an apparatus as set forth in embodiment 50, wherein at least one first wall of the first recess is aligned with a second wall of the second recess when the male and female portions of the mold are mated.

Embodiment 52 comprises an apparatus as set forth in any one of embodiments 50 and 51, wherein the first recess is aligned with the second recess when the male and female portions of the mold are mated.

Embodiment 53 comprises an apparatus as set forth in any one of embodiments 50-52, wherein a first press surface surrounds the first recess, and a second press surface surrounds the second recess.

Embodiment 54 comprises an apparatus as set forth in embodiment 53, wherein the first press surface and the second press surface are in contact with the reformed glass.

Embodiment 55 is an apparatus, comprising a wafer; a light-emitting device included on the wafer; a glass cover attached to the wafer, the glass cover hermetically sealing the light-emitting device; the glass cover including an optical window disposed at an oblique angle relative to an optical axis associated with the light-emitting device; and the optical window having a surface roughness Ra of less than 0.4 nanometers.

Embodiment 56 comprises an apparatus as set forth in embodiment 55, wherein the glass cover is attached to the wafer by diffusion bonding.

Embodiment 57 comprises an apparatus as set forth in embodiment 55, wherein the glass cover is attached to the wafer by anodic bonding.

Embodiment 58 comprises an apparatus as set forth in embodiment 55, wherein the glass cover is attached to the wafer by glass frit sintering.

Embodiment 59 comprises an apparatus as set forth in embodiment 55, wherein the glass cover is attached to the wafer by polymer bonding.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The invention claimed is:

1. An apparatus, comprising:

a male portion of a mold having a first recess;

a female portion of the mold having a second recess, where the female portion of the mold mates with the male portion of the mold;

the first recess is configured to form a first gas pocket and the second recess is configured to form a second gas pocket when the male and female portions of the mold are mated, where a cross sectional area of each of the first recess and the second recess is less than 15 square millimeters;

the male portion of the mold having a first press surface around a periphery of the first recess;

the female portion of the mold having a second press surface around a periphery of the second recess; and the first press surface and second press surface being configured to contact a reformed glass and a portion of the reformed glass is under tension while suspending the portion of reformed glass between the first recess and second recess.

2. The apparatus of claim 1, further comprising the reformed glass being disposed between the male and female portions of the mold.

3. The apparatus of claim 1, wherein at least one first wall of the first recess is aligned with a second wall of the second recess when the male and female portions of the mold are mated.

4. The apparatus of claim 1, wherein the first recess is aligned with the second recess when the male and female portions of the mold are mated.

5. The apparatus of claim 1, further comprising:

the reformed glass being disposed between the male and female portions of the mold; and a portion of the reformed glass is suspended between the first gas pocket and the second gas pocket.

6. The apparatus of claim 5, wherein the first recess is positioned on the first press surface, and the second recess is positioned on the second press surface.

7. The apparatus of claim 6, wherein the first press surface contacts a first surface of the reformed glass and the second press surface contacts a second surface of the reformed glass.

8. The apparatus of claim 7, wherein the reformed glass includes a projection.

9. The apparatus of claim 1, further comprising:

the male portion of the mold having a projection extending from a base surface;

the projection including the first press surface; and the first press surface being positioned at an angle relative to the base surface.

10. The apparatus of claim 9, further comprising the reformed glass disposed between the male and female portions of the mold, the first press surface contacting the reformed glass at a plurality of points, the plurality of points surrounding the first recess.

11. The apparatus of claim 1, further comprising:

the female portion of the mold has a base surface that extends to the second press surface and the second recess; and the second press surface being positioned at an angle in a range from 10 degrees to 45 degrees relative to the base surface.

* * * * *